United States Patent
Kang et al.

(10) Patent No.: US 10,580,719 B2
(45) Date of Patent: Mar. 3, 2020

(54) SEMICONDUCTOR MEMORY DEVICE PROVIDING ANALYSIS AND CORRECTING OF SOFT DATA FAIL IN STACKED CHIPS

(71) Applicant: Samsung Electronics Co., Ltd., Suwon-si, Gyeonggi-do (KR)

(72) Inventors: Donghun Kang, Yongin-si (KR); Kyoung-nam Ha, Seoul (KR); Hyungdong Kim, Suwon-si (KR); Jun-Phil Jung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/143,865

(22) Filed: May 2, 2016

(65) Prior Publication Data
US 2016/0357630 A1 Dec. 8, 2016

(30) Foreign Application Priority Data

Jun. 5, 2015 (KR) .................... 10-2015-0080063

(51) Int. Cl.
*G11C 29/00* (2006.01)
*H01L 23/48* (2006.01)
(Continued)

(52) U.S. Cl.
CPC ........ *H01L 23/481* (2013.01); *G06F 11/1012* (2013.01); *G11C 5/025* (2013.01); *G11C 29/022* (2013.01); *G11C 29/025* (2013.01); *G11C 29/4401* (2013.01); *G11C 29/52* (2013.01); *G11C 11/401* (2013.01); *G11C 11/4093* (2013.01); *H01L 23/49827* (2013.01); *H01L 23/49833* (2013.01); *H01L 24/13* (2013.01); *H01L 24/16* (2013.01); *H01L 24/17* (2013.01); *H01L 25/0652* (2013.01); *H01L 25/0657* (2013.01); *H01L 25/18* (2013.01);
(Continued)

(58) Field of Classification Search
None
See application file for complete search history.

(56) References Cited

U.S. PATENT DOCUMENTS 6,070,255 A * 5/2000 Dell .................... G06F 11/1052
714/48
6,647,518 B1 * 11/2003 Asmanis ................. H04L 1/203
714/707

(Continued)

FOREIGN PATENT DOCUMENTS

KR 20160120630 A 10/2016

*Primary Examiner* — Mujtaba M Chaudry
(74) *Attorney, Agent, or Firm* — Harness, Dickey & Pierce, P.L.C.

(57) ABSTRACT

The semiconductor memory device includes first group dies including at least one buffer die, and second group dies including a plurality of memory dies stacked on the first group dies and conveying data through a plurality of TSV lines. Here, at least one of the plurality of memory dies includes a first type ECC circuit which generates transmission parity bits using transmission data to be transmitted to the first group die, and the buffer die includes a second type ECC circuit which corrects, when a transmission error occurs in the transmission data received through the plurality of TSV lines, the transmission error using the transmission parity bits and generates error-corrected data.

16 Claims, 11 Drawing Sheets

(51) Int. Cl.
  *G11C 29/02* (2006.01)
  *G11C 29/52* (2006.01)
  *G11C 29/44* (2006.01)
  *G11C 5/02* (2006.01)
  *G06F 11/10* (2006.01)
  *G11C 11/4093* (2006.01)
  *H01L 25/18* (2006.01)
  *H01L 25/065* (2006.01)
  *H01L 23/00* (2006.01)
  *H01L 23/498* (2006.01)
  *G11C 11/401* (2006.01)

(52) U.S. Cl.
  CPC ............ *H01L 2224/13025* (2013.01); *H01L 2224/16146* (2013.01); *H01L 2224/16227* (2013.01); *H01L 2224/16235* (2013.01); *H01L 2224/1703* (2013.01); *H01L 2224/17181* (2013.01); *H01L 2225/06513* (2013.01); *H01L 2225/06517* (2013.01); *H01L 2225/06541* (2013.01); *H01L 2225/06548* (2013.01); *H01L 2924/10253* (2013.01); *H01L 2924/1431* (2013.01); *H01L 2924/1432* (2013.01); *H01L 2924/1434* (2013.01); *H01L 2924/1436* (2013.01); *H01L 2924/1437* (2013.01); *H01L 2924/15192* (2013.01); *H01L 2924/15311* (2013.01)

(56) References Cited

U.S. PATENT DOCUMENTS

| | | | |
|---|---|---|---|
| 8,739,011 B2 | 5/2014 | Johnson | |
| 9,471,417 B1* | 10/2016 | Asnaashari | G06F 11/1008 |
| 2009/0063923 A1* | 3/2009 | Gower | G06F 11/1048 714/746 |
| 2010/0060310 A1* | 3/2010 | Laisne | H01L 25/0657 326/10 |
| 2010/0269021 A1* | 10/2010 | Gower | G06F 11/10 714/764 |
| 2011/0042795 A1* | 2/2011 | Knickerbocker | H01L 21/486 257/686 |
| 2011/0090004 A1* | 4/2011 | Schuetz | G11C 29/808 327/564 |
| 2011/0161748 A1* | 6/2011 | Casper | G11C 5/02 714/708 |
| 2011/0258519 A1* | 10/2011 | Laevens | H04L 1/0057 714/776 |
| 2013/0031439 A1 | 1/2013 | Moon et al. | |
| 2013/0033973 A1* | 2/2013 | Suzuki | G11B 7/24073 369/44.13 |
| 2013/0082341 A1* | 4/2013 | Shimizu | H01L 27/14636 257/431 |
| 2014/0140138 A1* | 5/2014 | Tran | G11C 16/0483 365/185.18 |
| 2014/0223257 A1 | 8/2014 | Oh et al. | |
| 2014/0245098 A1 | 8/2014 | Sharon et al. | |
| 2014/0250353 A1 | 9/2014 | Choi et al. | |
| 2014/0317470 A1 | 10/2014 | Chung et al. | |
| 2014/0362637 A1 | 12/2014 | Jeong et al. | |
| 2014/0376295 A1 | 12/2014 | Oh et al. | |
| 2015/0115982 A1* | 4/2015 | Chen | G01R 27/2605 324/679 |
| 2015/0155039 A1* | 6/2015 | Tran | G11C 7/1045 365/185.18 |
| 2016/0300816 A1 | 10/2016 | Park | |

* cited by examiner

SEMICONDUCTOR MEMORY DEVICE PROVIDING ANALYSIS AND CORRECTING OF SOFT DATA FAIL IN STACKED CHIPS

CROSS-REFERENCE TO RELATED APPLICATION

A claim for priority under 35 U.S.C. § 119 to Korean Patent Application No. 10-2015-0080063 filed Jun. 5, 2015, in the Korean Intellectual Property Office, the disclosure of which is incorporated by reference herein its entirety.

BACKGROUND

Embodiments of the inventive concepts relate to a semiconductor memory device, and more particularly, to a semiconductor memory device with a stacked chip structure in which several dies are stacked.

A stacked chip structure such as high bandwidth memory (hereinafter referred to as "HBM") may provide the memory device with great capacity and high-speed operation.

The HBM may be implemented with a plurality of memory dies stacked on a buffer die (or a base die). The buffer die plays a role of a logic circuit to control the memory dies. Here, the buffer die and the memory dies are respectively connected by a through silicon via (hereinafter referred to as "TSV"). The TSV transfers data and control signals between the memory devices and the buffer die.

A 2.5D chip structure and a 3D chip structure have been known as the form of the stacked chip structure. The 2.5D chip structure is a chip structure in which the HBM and a host are connected to each other by means of an interposer instead of a printed circuit board (PCB) for electrical connection. The 3D chip structure is a chip structure in which the HBM is stacked on the host such that the host and the HBM are directly connected with an interposer.

An error may occur during data read operation due to a malfunction of the HBM or due to a transmission signal noise of the stacked chip structure. For correcting the error, the chip needs to identify whether the error is an error (or a memory die-based error) occurring within a memory die or whether the error is a transmission error due to noise.

Here, the transmission error which occurs due to noise when data is transmitted through the TSV is regarded as one type of soft data failure.

SUMMARY

Some embodiments of the inventive concepts provide a semiconductor memory device with a method of analysis and recovery to fix soft data fail in a stacked chip structure.

An embodiment of the inventive concepts provides a semiconductor memory device with a means to detect and fix a transmission error. The semiconductor memory device may include first group dies comprising at least one buffer die, and second group dies comprising a plurality of memory dies, the plurality of memory dies stacked on the first group dies and conveying data through a plurality of through silicon via (TSV) lines. Here, at least one of the plurality of memory dies may include a first type error correction coding (ECC) circuit which generates transmission parity bits using transmission data to be transmitted to the first group die, and the buffer die may include a second type ECC circuit which detects and corrects the transmission error using the transmission parity bits when a transmission error occurs in the transmission data received through the plurality of TSV lines.

The semiconductor memory device may be a stacked memory device configured to convey the data and control signals through the plurality of TSV lines.

The first type parity check circuit may generate a parity bit on data outputted from the memory dies before the transmission data is sent.

The transmission error occurring in the transmission data may be a soft data fail which occurs due to noise of the plurality of TSV lines.

The semiconductor memory device may be applied to a 3D chip structure or a 2.5D chip structure.

Each of the plurality of memory dies may include DRAM cells.

At least one of the plurality of memory dies may include DRAM cells.

The semiconductor memory device may be of a 3D chip structure to communicate with a host.

The host may be connected with the buffer die through a data bus.

Another aspect of embodiments of the inventive concepts is directed to provide a semiconductor memory device. The semiconductor memory device may include a buffer die on a substrate, and a plurality of memory dies stacked on the buffer die and conveying data through a plurality of through silicon via (TSV) lines. Each of the plurality of memory dies may include a first type error correction coding (ECC) circuit which generates transmission parity bits using transmission data to be transmitted to the first group die, and the buffer die may include a second type ECC circuit which checks whether a transmission error occurs in the transmission data received through the plurality of TSV lines and corrects the transmission error using the transmission parity bits when an transmission error is detected.

The semiconductor memory device may be a stacked memory device in which the buffer die and the memory dies are stacked on the substrate and are connected through the through silicon vias.

The transmission error occurring in the transmission data may include a soft data fail which occurs due to noise of the plurality of TSV lines.

The buffer die may communicate with a host through a data bus in a 2.5D chip structure.

An embodiment of the inventive concepts is directed to provide a semiconductor memory device with ECC circuits to correct an error occurring during data transmission. The semiconductor memory device may include first group dies comprising at least one buffer die, and second group dies comprising a plurality of memory dies which is stacked on the first group dies and conveys data through a plurality of through silicon via (TSV) lines. Here, at least one of the plurality of memory dies may include a cell core error correction coding (ECC) circuit which generates transmission parity bits using transmission data to be transmitted to the first group die, and the buffer die may include a via ECC circuit which corrects, when a transmission error occurs in the transmission data received through the plurality of TSV lines, the transmission error using the transmission parity bits, generates error-corrected data, and sends the error-corrected data to a host.

The cell core ECC circuit may perform error correction on data outputted from the memory dies before the transmission data is sent.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF THE EMBODIMENTS

Figure 1:
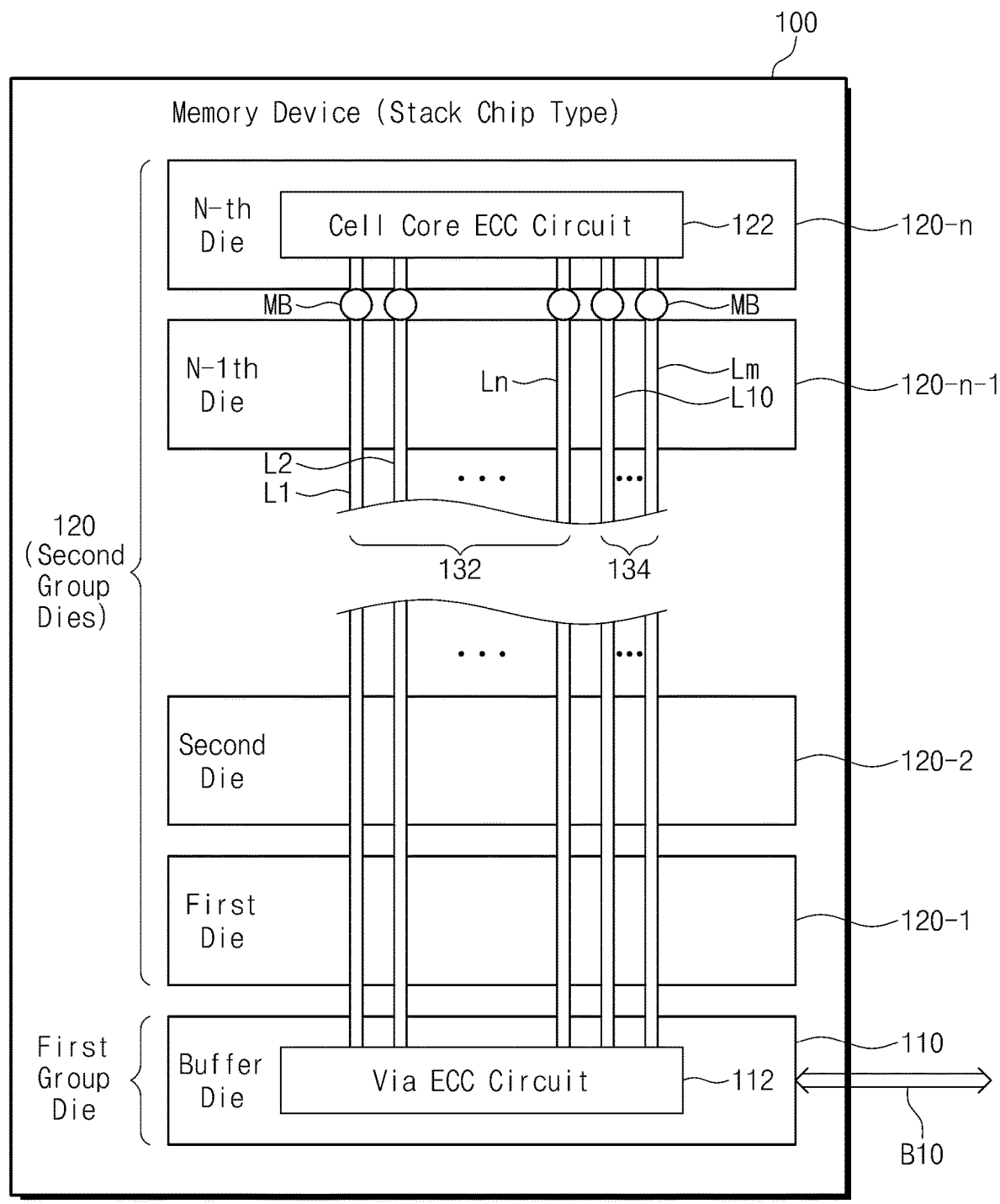
FIG. 1 is a block diagram schematically illustrating a semiconductor memory device according to an example embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art.

In the description below, when one part (or element, device, etc.) is referred to as being "connected" to another part (or element, device, etc.), it should be understood that the former can be "directly connected" to the latter, or "electrically connected" to the latter via an intervening part (or element, device, etc.). It will be further understood that when one component is referred to as being "directly connected" or "directly linked" to another component, it means that no intervening component is present.

With regard to description of drawings, similar components may be marked by similar reference numerals. In some drawings, a connection relation between elements and between lines may be for describing technical information effectively, and other elements or circuit blocks may be further included.

Embodiments disclosed herein may include their complementary embodiments. Note that details of fundamental operations such as a read operation, a write operation and the like of a volatile memory (e.g., a DRAM) and internal function circuits for performing the fundamental operations may be skipped to prevent the inventive concepts from becoming ambiguous.

FIG. 1 is a block diagram schematically illustrating a semiconductor memory device according to an example embodiment of the inventive concepts.

Referring to FIG. 1, a semiconductor memory device 100 may include first group dies 110 and second group dies 120 providing a soft error analyzing and correcting function in a stacked chip structure.

The first group die 110 may include at least one buffer die.

The second group dies 120 may include a plurality of memory dies 120-1 to 120-n which is stacked on the first group die 110 and conveys data through a plurality of TSVs.

At least one of the memory dies 120-1 to 120-n may include a first type error correction coding (ECC) circuit 122 which generates transmission parity bits based on transmission data to be sent to the first group die 110. The first type ECC circuit 122 may be referred to as "cell core ECC circuit".

The buffer die 110 may include a second type ECC circuit 112 which corrects a transmission error using the transmission parity bits when a transmission error is detected from the transmission data received through the TSV s and generates error-corrected data. The second type ECC circuit 112 may be referred to as "via ECC circuit".

The semiconductor memory device 100 may be a stack chip type memory device or a stacked memory device which conveys data and control signals through the TSV lines.

The TSV lines be also called "through electrodes".

The first type ECC circuit 122 may perform error correction on data which is outputted from the memory die 120-n before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 64-bit data, the transmission parity bits may be set to 8 bits. However, the scope and spirit of the inventive concepts are not limited thereto. The number of transmission parity bits increases or decreases.

With the above description, a TSV line group 132 which is formed at one memory die 120-n may include 64 TSV lines L1 to Ln, and a parity TSV line group 134 may include 8 TSV lines L10 to Lm.

The TSV lines L1 to Ln of the data TSV line group 132 and the parity TSV lines L10 to Lm of the parity TSV line group 134 may be connected to micro bumps MB which are correspondingly formed among the memory dies 120-1 to 120-n.

At least one of the memory dies 120-1 to 120-n may include DRAM cells each including at least one access transistor and one storage capacitor.

The semiconductor memory device 100 may have the 3D chip structure or the 2.5D chip structure to communicate with the host through a data bus B10.

The buffer die 110 may be connected with the host through the data bus B10.

The first type ECC circuit 122, denoted as the cell core ECC circuit, may output transmission parity bits as well as the transmission data through the parity TSV line group 134 and the data TSV line group 132 respectively. The outputted transmission data may be data which is error-corrected by the first type ECC circuit 122.

The second type ECC circuit 112, denoted as the via ECC circuit, may determine whether a transmission error occurs at the transmission data received through the data TSV line group 132, based on the transmission parity bits received through the parity TSV line group 134. When a transmission error is detected, the second type ECC circuit 112 may correct the transmission error on the transmission data using the transmission parity bits. When the transmission error is uncorrectable, the second type ECC circuit 112 may output information indicating occurrence of an uncorrectable data error.

When an error is detected from read data in the HBM or the stacked memory structure, the error is an error occurring due to noise while data is transmitted through the TSV.

According to an example embodiment of the inventive concepts, as illustrated in FIG. 1, the cell core ECC circuit 122 may be included in the memory die, and the via ECC circuit 112 may be included in the buffer die. Accordingly, it may be possible to detect and correct soft data fail. The soft data fail may include a transmission error which is generated due to noise when data is transmitted through TSV lines.

Figure 2:
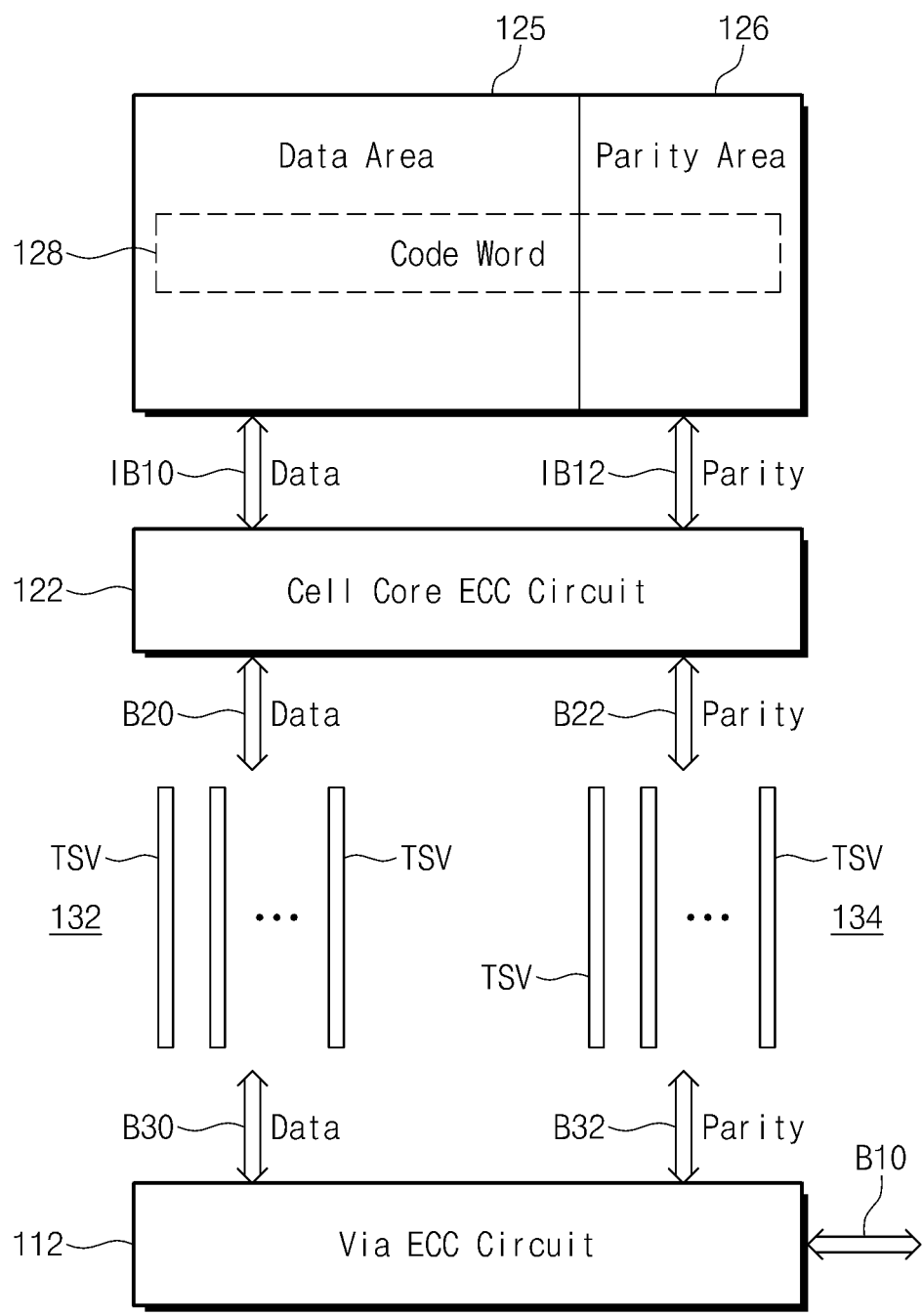
FIG. 2 is a diagram schematically illustrating connections between ECC circuits of FIG. 1.

FIG. 2 is a diagram schematically illustrating connections between ECC circuits of FIG. 1.

Referring to FIG. 2, the cell core ECC circuit 122 and the via ECC circuit 112 may be connected through the data TSV line group 132 and the parity TSV line group 134.

More particularly, one memory die may include a memory cell array, and the memory cell array may include a data area 125 storing data and a parity area 126 storing parity information.

In the case of reading data, a code word 128 which is composed of data from the data area 125 and data from the parity area 126 may be a hamming code. According to an example embodiment of the inventive concepts, the code word 128 may include 64-bit data and 8-bit parity data.

The cell core ECC circuit 122 may receive data through an internal data bus IB10 and parity through an internal parity bus IB12. The cell core ECC circuit 122 may check a read error on the data using the parity and may perform error correction based on the checking result.

The cell core ECC circuit 122 may output the error-corrected data as transmission data through a data bus B20 and may output transmission parity bits through a parity bus B22. Here, the transmission parity bits may be the same information as the parity.

The via ECC circuit 112 may receive the transmission data through a data bus B30 and the transmission parity bits through a parity bus B32.

The data bus B20 and the data bus B30 may be implemented with the data TSV line group 132 described with reference to FIG. 1.

The parity bus B22 and the parity bus B32 may be implemented with the parity TSV line group 134 described with reference to FIG. 1.

The via ECC circuit 112 may perform error checking on the transmission data received through the data TSV line group 132, based on the transmission parity bits received through the parity TSV line group 134. When a transmission error is detected through the error checking, the second type ECC circuit 112 may correct the transmission error on the transmission data, based on the transmission parity bits. For example, in the case where the number of correctable data bits is one, error correction may be impossible when the transmission error which includes two or more error bits occurs. In this case, the second type ECC circuit 112 may output information indicating occurrence of a data error to the data bus B10.

In the case where error correction is performed, error-corrected transmission data may be outputted to the data bus B10.

Figure 3:
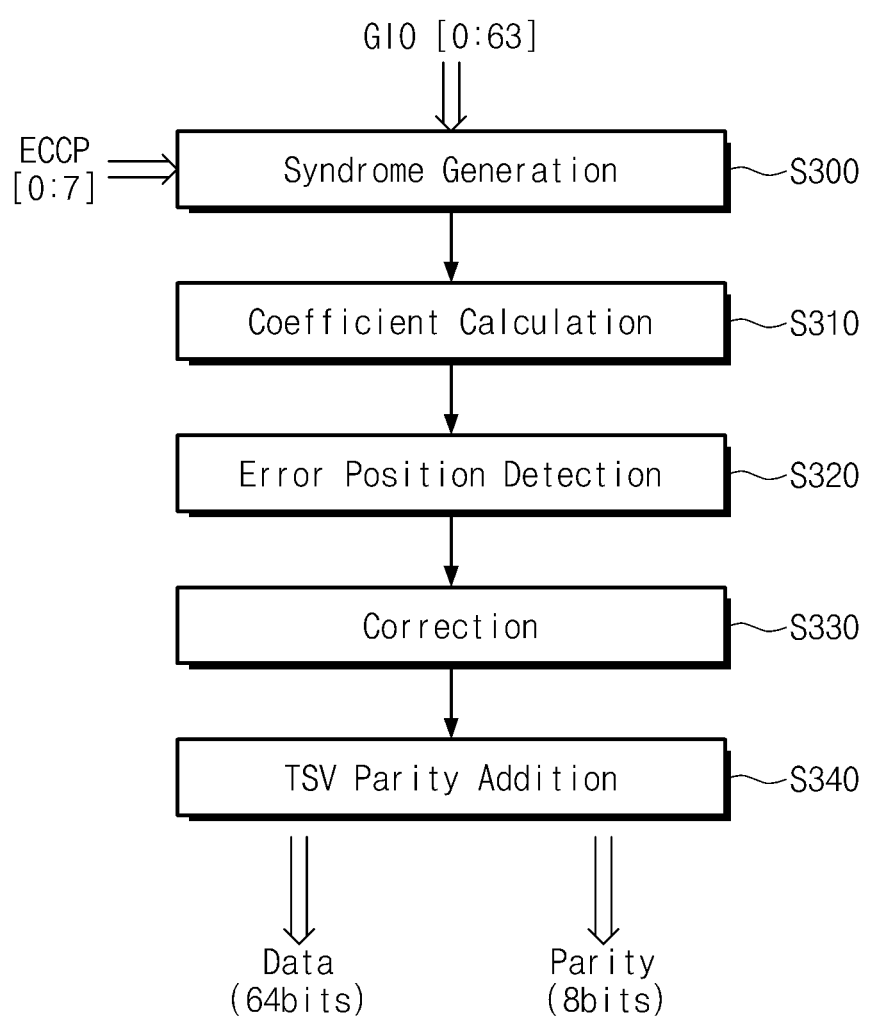
FIG. 3 is a diagram schematically illustrating generation of transmission data and transmission parity data associated with FIG. 1.

FIG. 3 is a diagram schematically illustrating generation of transmission data and transmission parity data associated with FIG. 1.

Referring to FIG. 3, in step S300, the cell core ECC circuit 122 of FIG. 1 may perform a syndrome generating operation. For this end, 64-bit output data which is provided by way of global input/output lines GIO[0:63] corresponding to the internal data bus IB10 of FIG. 2 and 8-bit parity which is provided through parity data lines ECCP[0:7] may be provided to a syndrome generator. The parity and the output data may be logically combined through an XOR array (not illustrated), and thus 8-bit syndrome data may be generated.

The cell core ECC circuit 122 may perform coefficient calculation in step S310. The coefficient calculation may be accomplished by calculating a coefficient of an error position equation using the syndrome data S[0:7]. Also, the cell core ECC circuit 122 may detect an error position in step S320 at the same time with step S310. For example, a position of a 1-bit error on the output data may be detected by using the syndrome data S[0:7]. The error position equation may be an equation which uses a reciprocal of an error bit as a root.

The cell core ECC circuit 122 may perform an error correction operation in step S330. The error correction may be accomplished by inverting a logical value of a bit, at which an error occurs, from among 64-bit data based on error position detection information.

Error-corrected 64-bit data Data[0:63] may be obtained through ECC decoding on read data in step S330.

The cell core ECC circuit 122 may perform a TSV parity adding operation in step S340. The TSV parity adding operation may include outputting the error-corrected 64-bit data as transmission data and outputting 8-bit TSV parity for detection and correction of soft data fail. In the case where no error occurs at the read data or an error is corrected, the transmission data may be the same as the read data. The TSV parity may be generated by performing an XOR array operation on the transmission data and given bits for parity generation.

The cell core ECC circuit 122 may also perform ECC encoding for generating parity bits on data Data[0:63] to be written at memory cells. The cell core ECC circuit 122 may generate write parity bits by performing the XOR array operation on 64-bit write data Data[0:63] and bits of "b'00000000". Here, the bits of "b'00000000" may be setting bits which allow write parity bits to be generated with respect to the 64-bit write data Data[0:63]. The write parity bits on the 64-bit write data Data[0:63] may be generated based on specific bits different from the bits of "b'00000000".

Figure 4:
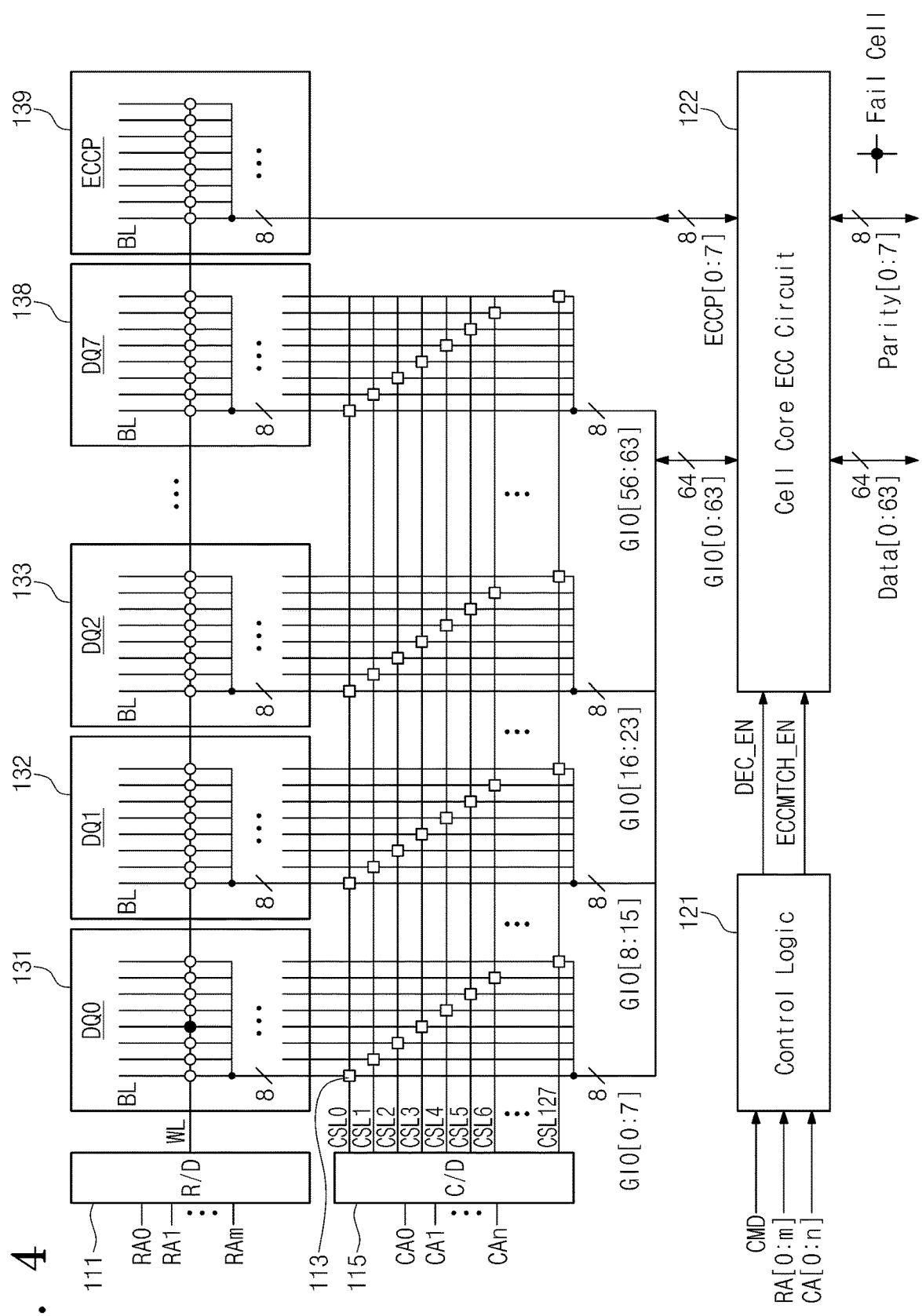
FIG. 4 is a diagram illustrating a detailed circuit configuration of a memory die of FIG. 1.

FIG. 4 is a diagram illustrating a detailed circuit configuration of a memory die of FIG. 1.

Referring to FIG. 4, a memory die may include a plurality of main memory cell blocks 131 to 138 and a memory cell block for ECC 139 in a memory cell array. The memory die may also include control logic 121 and the cell core ECC circuit 122.

In FIG. 4, the number of the main memory cell blocks 131 to 138 or the size of each memory cell block may be associated with a memory capacity of the memory die.

Each of the main memory cell blocks 131 to 138 may include a plurality of memory cells which is arranged in a matrix of rows and columns. As well as the main memory cell blocks 131 to 138, the memory cell block for ECC 139 may include a plurality of memory cells which is arranged in a matrix of rows and columns.

An embodiment of the inventive concepts discloses a memory die that have a 64-bit data input/output organization.

Since data stored at memory cells of each of the main memory cell blocks 131 to 138 is inputted and outputted through data input/output pads DQ0 to DQ7 corresponding thereto in the embodiment, main memory cell blocks 131 to 138 may be referred to as "DQ0 to DQ7 cell blocks", respectively. Furthermore, the memory cell block for ECC 139 may be referred to as "ECC cell block".

Each of the DQ0 to DQ7 cell blocks 131 to 138 may include 8K rows, for example, 8K word lines and 1K columns, for example, 1K bit lines. Each of memory cells respectively arranged at intersections of the word lines and the bit lines may be a DRAM cell which includes an access transistor and a storage capacitor. The word lines of the DQ0 to DQ7 cell blocks 131 to 138 may be enabled according to a result of decoding row address signals RA0 to RAm, and the bit lines thereof may be enabled according to a result of decoding column address signals CA0 to CAn.

The row address signals RA0 to RAm may be decoded through a row decoder 111, and a word line may be selected according to a result of decoding the row address signals RA0 to RAm. The column address signals CA0 to CAn may be decoded through a column decoder 115. The column decoder 115 may decode the column address signals CA0 to CAm and may generate column selection signals CSL0 to CSL127 selecting a bit line. To support a burst length indicating the maximum number of column locations to be accessed, bit lines may be simultaneously accessed as many as the burst length.

In the memory die according to an example embodiment of the inventive concepts, a burst length (BL) may be set to 8. Accordingly, the bit lines may be connected with a column selection unit 113 which is connected with each of the 128 column selection signals CSL0 to CSL127, and 8 bit lines may be simultaneously selected by the column selection unit 113. Each of the column selection units 113 may include 8 switches, which are turned on by a corresponding one of the column selection signals CSL0 to CSL127.

In the DQ0 cell block 131, a plurality of memory cells may be connected with a word line accessed by the row address signals RA0 to RAm. 8 memory cells of the plurality of memory cells may be selected by the column selection unit 113 connected with the column selection signal CSL0 and may be connected with first data lines GIO[0:7]. Each of the first data lines GIO[0:7] may be composed of 8 bits. In the DQ0 cell block 132, 8 memory cells of the plurality of memory cells may be selected by the column selection unit 113 connected with the column selection signal CSL0 and may be connected with second data lines GIO[8:15]. In each of the DQ2 to DQ7 cell blocks 133 to 138, 8 memory cells of a plurality of memory cells connected with a word line may be selected by the column selection unit 113 connected with the column selection signal CSL0 and may be connected with a corresponding one of third to eighth data lines GIO[16:23] to GIO[56:63].

As well as the DQ0 to DQ7 cell blocks 131 to 138, the ECC cell block 139 may include 8K word lines. Unlike the DQ0 to DQ7 cell blocks 131 to 138, the ECC cell block 139 may include 8 bit lines. Memory cells which are respectively arranged at intersections of the word lines and the bit lines of the ECC cell block 139 may be DRAM cells.

In the ECC cell block 139, 8 bit lines may be connected with a parity data line ECCP[0:7]. Parity bits associated with data Data[0:63] stored at memory cells may be transmitted to the parity data line ECCP[0:7]. The parity bits may be stored at 8 memory cells in the ECC cell block 139 through the parity data line ECCP[0:7]. Furthermore, the stored parity bits may be read from the 8 memory cells in the ECC cell block 139. In this case, the 8 memory cells of the ECC cell block 139 may be connected with the same word line as a word line of a defective cell.

The control logic 121 may receive a command CMD indicating a read operation or a write operation and the row address signals RA0 to RAm and the column address signals CA0 to CAn applied together with the command CMD. The control logic 121 may compare a defective cell address, stored at a fail address storing unit, with the row address RA[0:m] or the column address CA[0:n]. The fail address storing unit may store location information on defective memory cells of memory cells of the main memory cell blocks 131 to 138. Here, the defective memory cells may mean weak cells which store data normally but have relatively low data retention ability.

In the case where the comparison result indicates that the defective cell address is the same as the row address RA[0:m] or the column address CA[0:n], the control logic 121 may generate an ECC match signal ECCMTCH_EN.

The control logic 121 may generate an ECC indication signal DEC_EN, indicating an ECC (error correction code) decoding and encoding operation, in response to the command CMD. The control logic 121 may control the ECC decoding operation in response to a command CMD corresponding to a read operation, for example, by generating the ECC indication signal DEC_EN of a logic high level. The control logic 121 may control ECC encoding in response to a command CMD corresponding to a write operation, for example, by generating the ECC indication signal DEC_EN of a logic low level.

The cell core ECC circuit 122 may perform ECC decoding or ECC encoding in response to the ECC indication signal DEC_EN and the ECC match signal ECCMTCH_EN.

The cell core ECC circuit 122 may output data, error-corrected at the ECC decoding operation, as transmission data Data[0:63] through the data TSV line group 132 of FIG. 2 and may output transmission parity bits Parity[0:7] through the parity TSV line group 134 of FIG. 2. The data TSV line group 132 may correspond to lines outputting the transmission data Data[0:63], and the parity TSV line group 134 may correspond to lines outputting the transmission parity bits Parity[0:7].

At a write operation, the cell core ECC circuit 122 may generate parity bits on write data Data[0:63] in response to the ECC match signal ECCMTCH_EN and may send the parity bits to the parity data line ECCP[0:7]. The parity bits on the parity data line ECCP[0:7] may be stored at memory cells of the ECC cell block 139 connected with a word line of a defective cell. In FIG. 4, when a defective cell (marked by ●) among memory cells of the DQ0 to DQ7 cell blocks 131 to 138 which are selected by a word line and the column selection unit 113 connected with the column selection signal CSL0 is located in the DQ0 cell block 131, parity bits may be generated with respect to data Data[0:63] to be written at memory cells including the defective cell. The parity bits generated may be stored at memory cells of the ECC cell block 139 connected with a corresponding word line.

During data read operation, the cell core ECC circuit 122 may receive data to be transferred to the first to eight data lines GIO[0:7] to GIO[56:63] and data to be transferred to the parity data line ECCP[0:7] in response to the ECC match signal ECCMTCH_EN. Data to be transferred to the first to eight data lines GIO[0:7] to GIO[56:63] may be data stored at memory cells, connected with a word line of a defective cell from among memory cells in the DQ0 to DQ7 cell blocks 131 to 138. The data to be transferred to the parity data line ECCP[0:7] may be parity bits stored at memory cells, connected with the word line, from among memory cells in the ECC cell block 139.

The cell core ECC circuit 122 may generate syndrome data using data transferred to the first to eight data lines GIO[0:7] to GIO[56:63] and the parity data line ECCP[0:7] and may calculate a position of a defective cell, that is, an error bit position. Furthermore, the cell core ECC circuit 122 may correct data corresponding to the error bit position and may output error-corrected data Data[0:63] and the transmission parity bits Parity[0:7].

Figure 5:
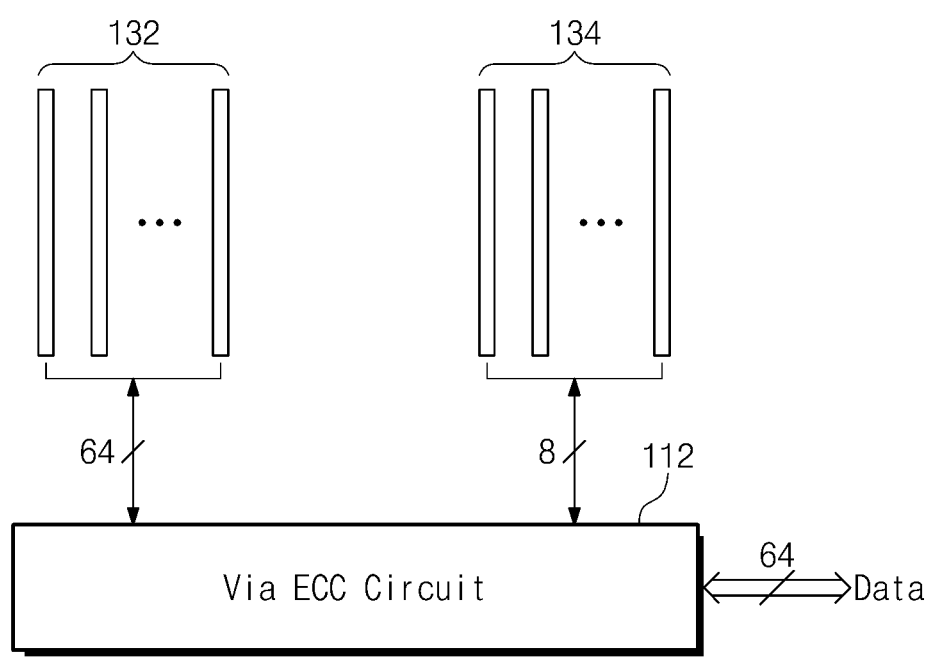
FIG. 5 is a diagram schematically illustrating a data bit organization of an ECC circuit of a butter die of FIG. 1.

FIG. 5 is a diagram schematically illustrating a data bit organization of an ECC circuit of a buffer die of FIG. 1.

Referring to FIG. 5, the via ECC circuit 112 may receive 64-bit transmission data by way of the data TSV line group 132. The via ECC circuit 112 may receive 8-bit transmission parity data by way of the parity TSV line group 134.

The via ECC circuit 112 may check soft data fail on the transmission data using the transmission parity bits; if the soft data fail is detected, the via ECC circuit 112 may correct a transmission error on the transmission data using the transmission parity bits. The ECC circuit exemplifies that the number of correctable data bits is two. If three or more transmission error bits occur, the second type ECC circuit 112 may output information indicating occurrence of an uncorrectable data error, to the data bus B10. In the case where error correction is successfully performed, error-corrected transmission data may be outputted to the data bus B10.

Figure 6:
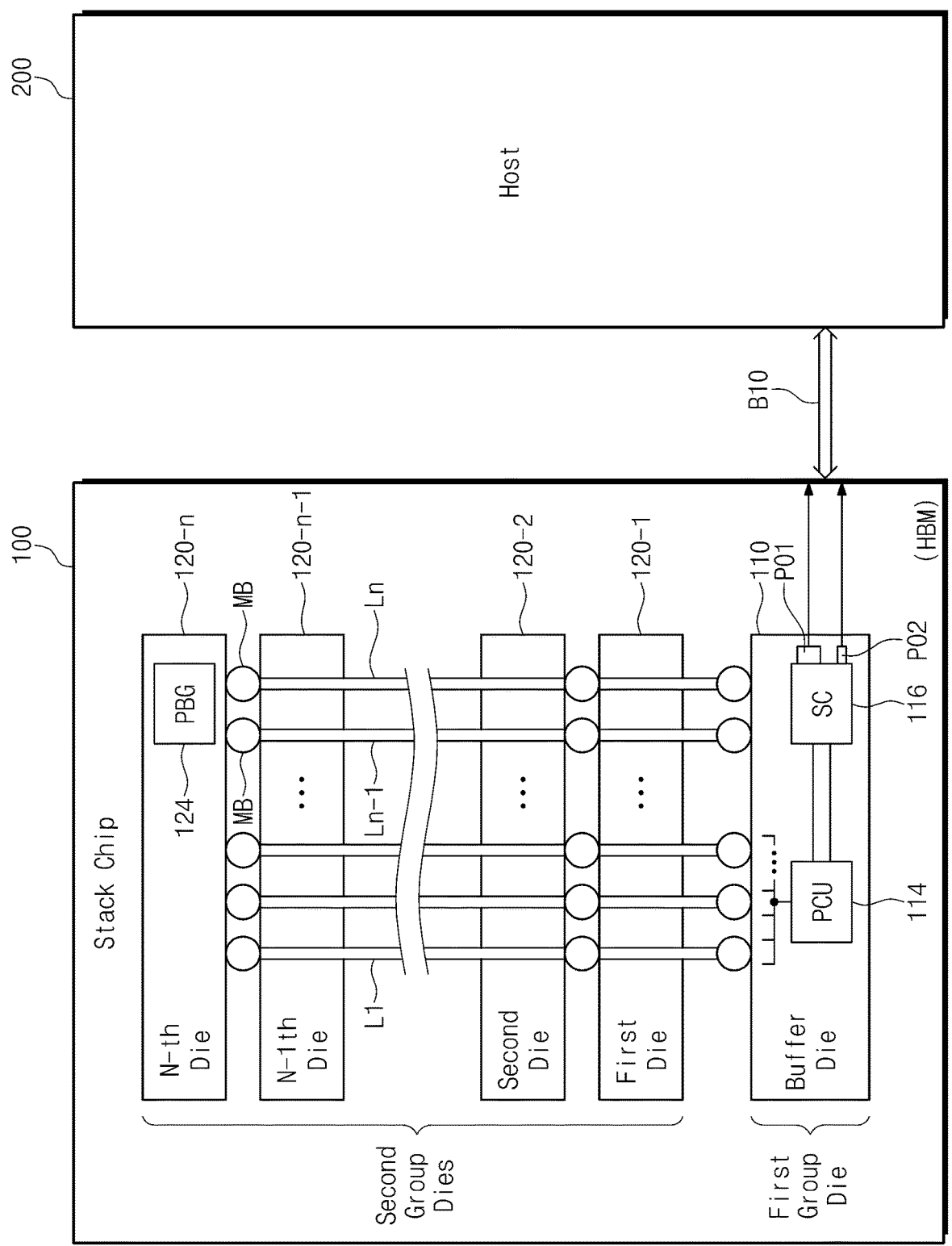
FIG. 6 is a block diagram schematically illustrating a semiconductor memory device according to another example embodiment of the inventive concepts.

FIG. 6 is a block diagram schematically illustrating a semiconductor memory device according to an example embodiment of the inventive concepts.

Referring to FIG. 6, the semiconductor memory device 100 may be connected with a host 200 through the bus B10.

A semiconductor memory device 100 may include a buffer die 110 and a plurality of memory dies 120-1 to 120-n.

The buffer die 110 may be formed on a substrate.

The memory dies 120-1 to 120-n may be stacked on the buffer die 110 and may convey data by way of a plurality of TSV lines.

Each of the memory dies 120-1 to 120-n may include a parity bit generator (PBG) 124 which generates transmission parity data using transmission data to be transferred to the buffer die 110.

The buffer die 110 may include a parity check unit (PCU) 114 which checks whether a transmission error occurs at the transmission data received through the TSV lines, based on the transmission parity data.

The buffer die 110 may further include a selection circuit (SC) 116 which selects a fail signal provided from the parity check unit 114 when the transmission error occurs at the transmission data and outputs the fail signal to an external error port PO2.

When the transmission error does not occur at the transmission data, the selection circuit 116 may select the transmission data and may output the selected transmission data to an external data output port PO1.

The parity bit generator 124 may combine bits of the transmission data and may generate transmission parity data. For example, for the even parity policy, if transmission data is "1111", the number of 1's may be even. For this reason, a parity bit of "0" may be generated, and combination data may be "11110".

If the combination data of "11110" is received, the parity check unit 114 may determine a parity check result as "Pass". In this case, that a transmission error does not occur may be determined.

If combination data of "11100" is received, the parity check unit 114 may determine a parity check result as "Fail". The reason may be that the number of 1's is odd.

In the case where the parity check result indicates "Pass," the transmission data may be sent to the host 200.

In the case where the parity check result indicates "Fail," an error signal may be transmitted through an error port of the buffer die 110. In this case, a command may be again executed under a control of the host 200.

Each of the memory dies 120-1 to 120-n may include a plurality of memory cells each having an access transistor and a storage capacitor.

The semiconductor memory device 100 may be applied to the 3D chip structure or the 2.5D chip structure.

In FIG. 6, detection of a 1-bit error is disclosed to limit the overhead of a chip size on a memory die. This example illustrates a 1-bit error detecting operation and thus error correction may not be possible. Including an ECC circuit may allow the correction of the 1-bit error at the cost of chip size overhead. As the number of parity bits for error correction increases, the number of correctable data bits may increase; however, overhead of a chip size may increase according to an increase in the number of parity bits. As illustrated in FIG. 6, the parity bit generator 124 may reduce chip size overhead, and the parity check unit 114 may be implemented in the buffer die 110. A fail signal may be outputted to the external error port PO2 when a transmission error occurs at transmission data, and the transmission data may be outputted to the external data output port PO1 when no transmission error occurs at the transmission data.

For preventing to process erred data in a system, host 200 needs to recognize that soft data fail occurs at a memory die, transmission data at which a transmission error occurs may not be provided to the host 200, instead, error detection signal may be sent to the host 200.

In the case where the error occurs, it may be possible to distinguish whether of the error comes from soft data fail or the malfunction of a memory die. When the parity check result indicates "Pass" or while there is an error in the transmitted data, it may be determined that the error occurs at the memory die. In contrast, when a parity check result indicates "Fail," it may be determined that the error occurs due to a transmission path such as TSV lines.

Figure 7:
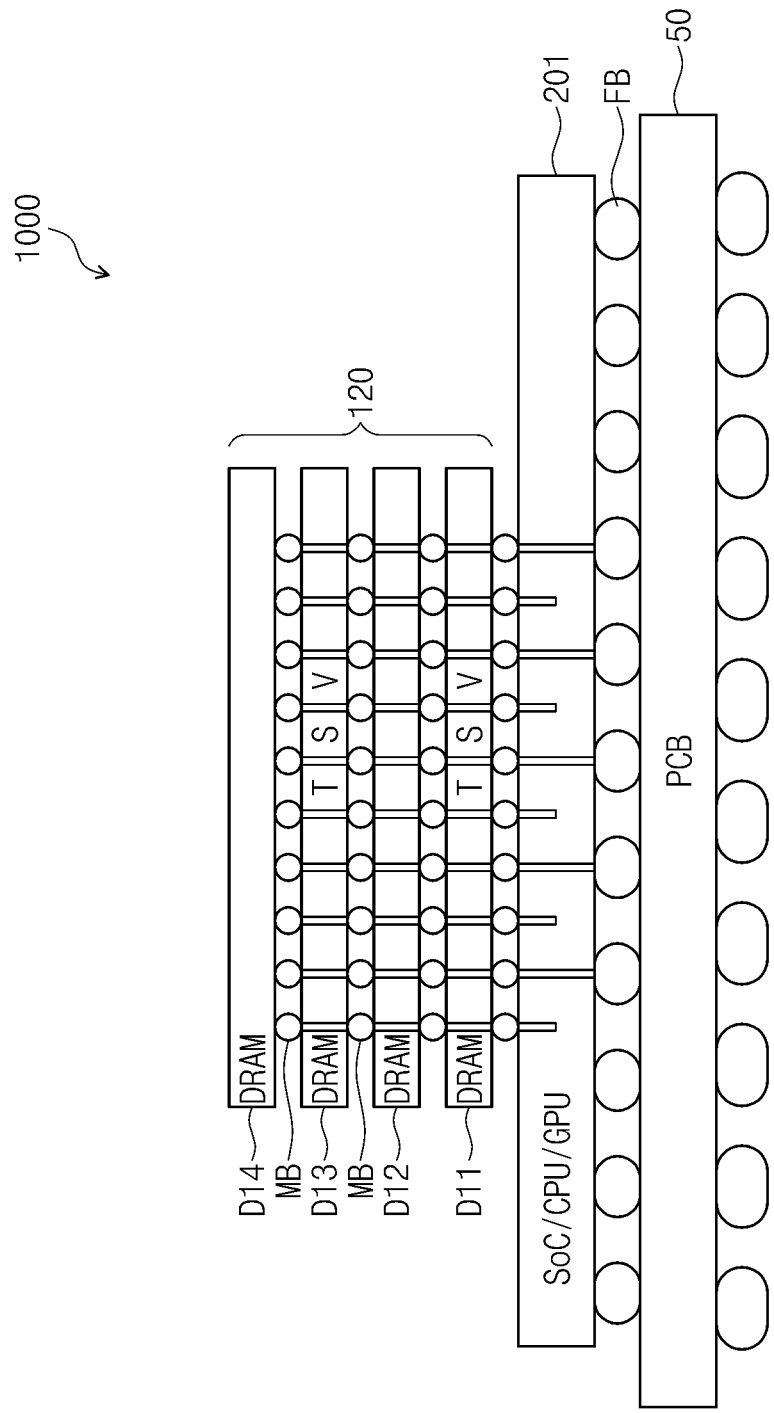
FIG. 7 is a cross-sectional view of a 3D chip structure according to an example embodiment of the inventive concepts.

FIG. 7 is a cross-sectional view of a 3D chip structure according to an example embodiment of the inventive concepts.

Referring to FIG. 7, a host die 201 such as SoC, CPG, or GPU may be disposed on a PCB 50 using flip chip bumps FB. Memory dies D11 to D14 may be stacked on the host die 201 to implement a HBM structure. In FIG. 7, an embodiment of the inventive concepts is exemplified as a buffer die 110 or a logic die of FIG. 1. However, the buffer die 110 or the logic die may be disposed between the memory die D11 and the host die 201. To implement the HBM (120) structure, TSV lines called may be formed at the memory dies D11 and D14. The TSV lines may be electrically connected with micro bumps MB placed between memory dies.

FIG. 7 shows a 3D chip structure 1000 in which a host and a HBM are directly connected without an interposer layer. An embodiment of the inventive concepts may be applicable to the 3D chip structure 1000 illustrated in FIG. 7.

Figure 8:
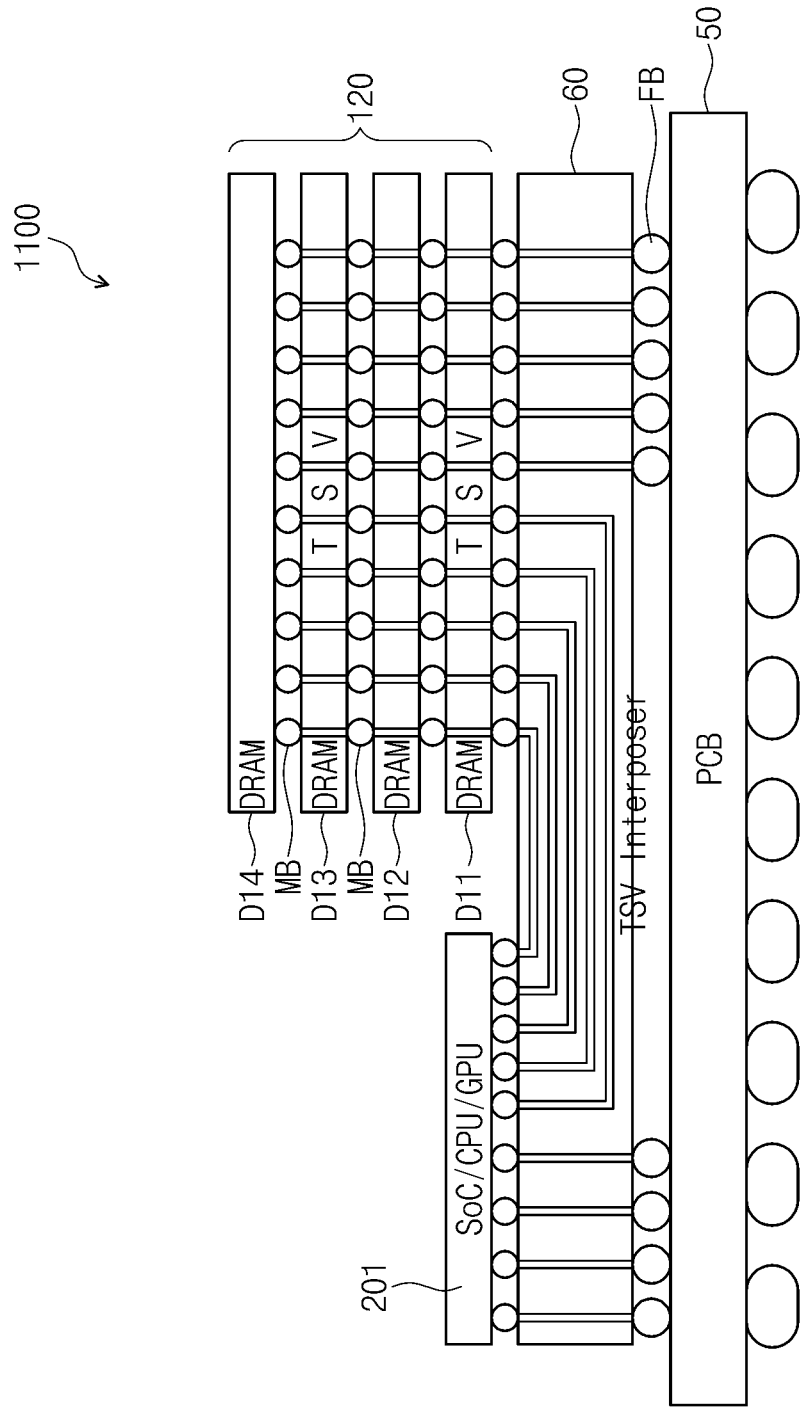
FIG. 8 is a cross-sectional view of a 2.5D chip structure according to an example embodiment of the inventive concepts.

FIG. 8 is a cross-sectional view of a 2.5D chip structure according to an example embodiment of the inventive concepts.

Referring to FIG. 8, a 2.5D chip structure 1100 may be a chip structure in which the HBM 120 and a host are connected through an interposer layer 60 instead of a PCB. The interposer layer 60 may be disposed on the PCB 50 and may be electrically connected with the PCB 50 by way of the flip chip bumps FB.

The host die 201 and the memory dies D11 to D14 for implementing the HBM (120) structure may be disposed on the interposer layer 60. In FIG. 8, an embodiment of the inventive concepts is exemplified as a buffer die 110 or a logic die of FIG. 1. However, the buffer die 110 or the logic die may be disposed between the memory die D11 and the interposer layer 60. To implement the HBM (120) structure, TSV lines may be formed at the memory dies D11 to D14. The TSV lines may be electrically connected with micro bumps MB disposed between memory dies.

FIG. 8 shows the 2.5D chip structure 1100 including the interposer layer 60. An embodiment of the inventive concepts may be applicable to the 2.5D chip structure 1100 illustrated in FIG. 8.

Figure 9:
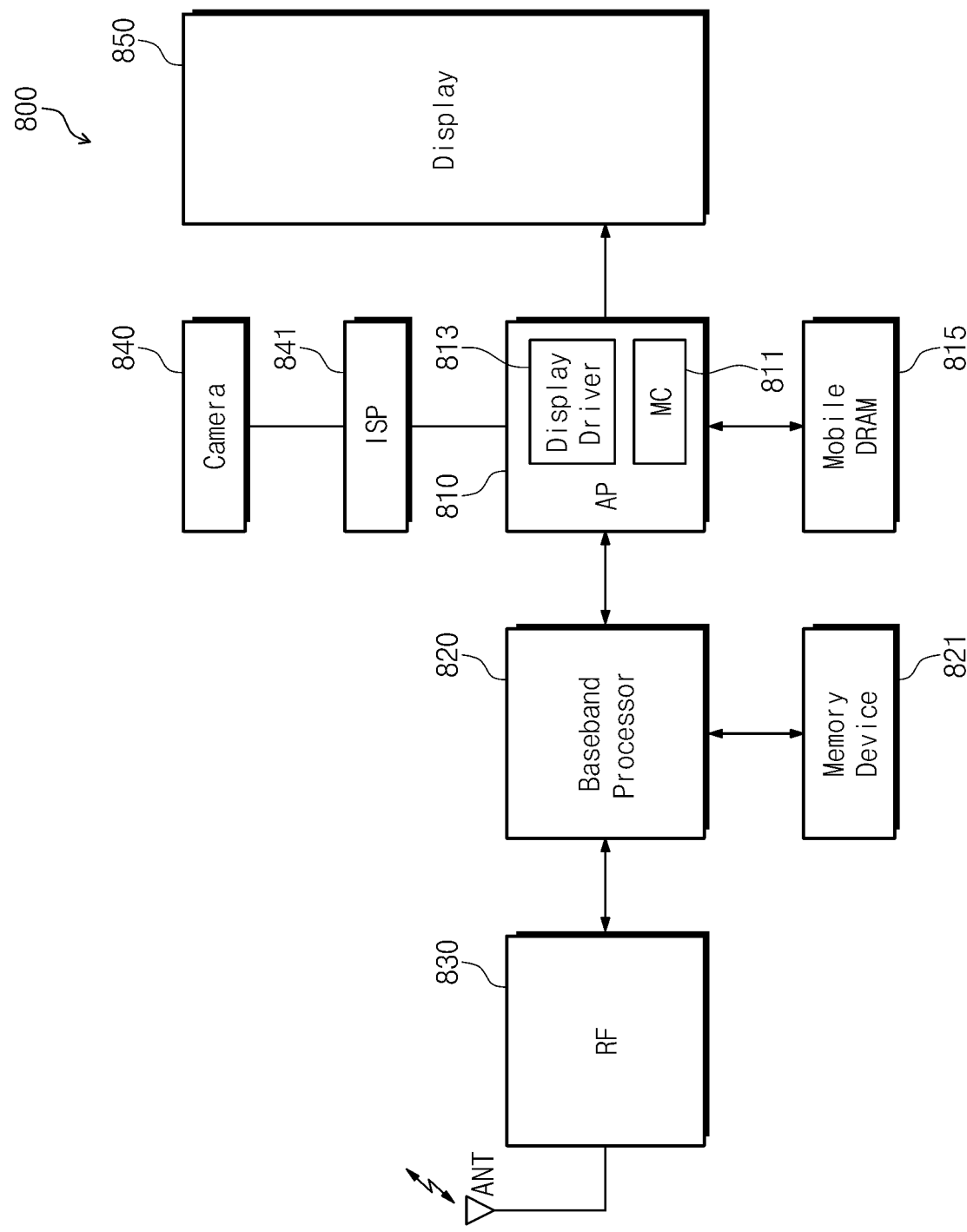
FIG. 9 is a block diagram schematically illustrating a smart phone according to an example embodiment of the inventive concepts.

FIG. 9 is a block diagram schematically illustrating a smart phone according to an example embodiment of the inventive concepts.

Referring to FIG. 9, a smart phone 800 may be implemented with a mobile computing device. The mobile computing device may be changed or expanded into one of a ultra-mobile personal computer (UMPC), a workstation, a net-book, a personal digital assistance (PDA), a portable computer, a web tablet, a tablet computer, a wireless phone, a mobile phone, a smart phone, an e-book, a portable multimedia player (PMP), a portable game console, a navigation device, a black box, a digital camera, a digital multimedia broadcasting (DMB) player, a 3-dimensional television, a digital audio recorder, a digital audio player, a digital picture recorder, a digital picture player, a digital video recorder, a digital video player, storage as a data center, a device for transmitting and receiving information in a wireless environment, one of various electronic devices constituting a home network, one of various electronic devices constituting a computer network, one of various electronic devices constituting a telematics network, a radio frequency identification (RFID) device, or one of various components constituting a computing system.

An application processor (AP), for example, a mobile application processor 810 may control components 815, 820, 841, and 850 of the smart phone 800.

The mobile application processor 810 may use a mobile DRAM 815 as a work memory. A memory device 821 may be used as a work and program memory of a baseband processor 820.

In FIG. 9, the mobile DRAM 815 may be implemented to have the HBM structure according to an example embodiment of the inventive concepts. Therefore, it may be easy to analyze and relieve soft data fail in a stacked chip structure.

A memory controller (MC) 811 included in the application processor 810 may control an access to the mobile DRAM 815.

A display driver 813 included in the application processor 810 may control a display 850. The display 850 may be implemented with a thin film transistor liquid crystal display (TFT-LCD), a light-emitting diode (LED) display, an organic LED (OLED) display, an active-matrix OLED (AMOLED) display, or a flexible display.

The baseband processor 820 may allow data to be exchanged between a wireless transceiver 830 and the application processor 810. Data processed by the baseband processor 820 may be sent to the application processor 810 or may be stored at the memory device 821.

The memory device 821 may be implemented with a volatile memory or a nonvolatile memory. The volatile memory may be a dynamic random access memory (DRAM), a static random access memory (SRAM), a thyristor RAM (TRAM), a zero capacitor RAM (Z-RAM), or a twin transistor RAM (TTRAM).

The nonvolatile memory may be an electrically erasable programmable read-only memory (EEPROM), a flash memory, a magnetic RAM (MRAM), a spin-transfer torque MRAM(STT-MRAM), a conductive bridging RAM (CBRAM), a ferroelectric RAM (FeRAM), a phase change RAM (PRAM) called OUM (Ovonic Unified Memory), a resistive RAM (RRAM or ReRAM), a nanotube RRAM, a polymer RAM (PoRAM), a nano floating gate memory (NFGM), a holographic memory, a molecular electronics memory device, or insulator resistance change memory. One or more bits may be stored at a unit cell of the nonvolatile memory.

Wireless data received through an antenna ANT may be transmitted to the baseband processor 820 by way of the wireless transceiver 830, and data outputted from the baseband processor 820 may be converted into wireless data by the wireless transceiver 830. The converted wireless data may be outputted through the antenna ANT.

The image signal processor 841 may process a signal from a camera (or an image sensor) 840 and may transfer the processed data to the application processor 810.

The application processor 810 may control execution of at least one of web browsing, e-mail access, video playback, document editing, and image editing.

Figure 10:
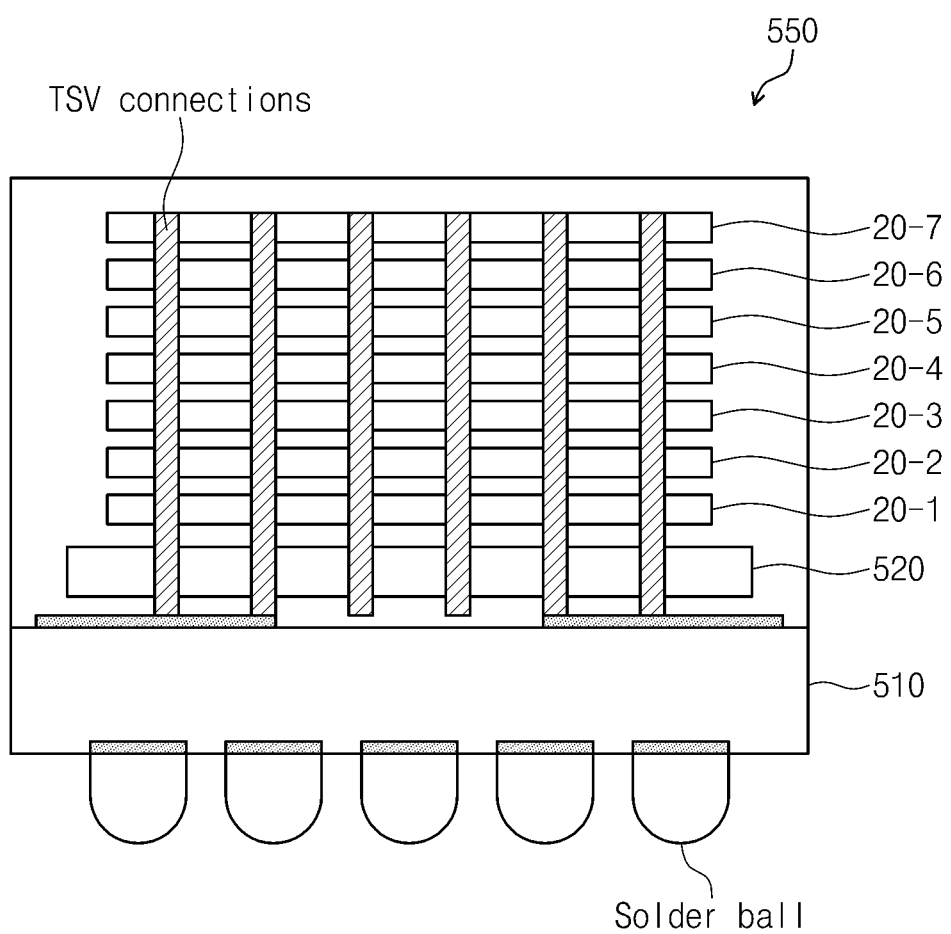
FIG. 10 is a cross-section view of a memory system in which memory devices are stacked through TSVs, according to an example embodiment of the inventive concepts.

FIG. 10 is a cross-section view of a memory system in which memory devices are stacked through TSVs, according to an example embodiment of the inventive concepts.

As illustrated in FIG. 10, a memory system 550 may include memory devices 20-1 to 20-7 which are stacked on a logic layer 520. The logic layer 520 may be stacked on a package substrate 510. Here, a structure and an operation of each of the memory devices 20-1 to 20-7 may be substantially the same as those of the above-described semiconductor memory device.

A command, an address, and data may be exchanged among the components 20-1 to 20-7, 520, and 510 of FIG. 10 by way of vertical electrical connections, for example, TSVs.

Therefore, the memory system 500 of FIG. 10 may be implemented in a HBM structure or a stacked chip structure according to an example embodiment of the inventive concepts, and thus soft data fail as an error occurring at data transmission may be easily analyzed and corrected.

The memory devices 20-1 to 20-7 may be packaged according to any of a variety of different packaging technologies. Examples of such packaging technologies may include the following: Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In FIG. 10, an embodiment of the inventive concepts is exemplified as semiconductor memory devices are implemented with a DRAM. However, the scope and spirit of the inventive concepts may not be limited thereto. For example, semiconductor memory devices may be implemented with MRAMs instead of the DRAM. A semiconductor memory device such as a SRAM or a DRAM may lose data stored therein at power-off.

In contrast, a nonvolatile semiconductor memory device such as an MRAM may retain data stored therein even at power-off. Therefore, the nonvolatile semiconductor memory device may be used to retain data even at power failure or interruption of a power supply.

In the case where a memory is implemented with the STT-MRAM, advantages of both the DRAM and the MRAM may be utilized.

An STT-MRAM cell may include a magnetic tunnel junction (MTJ) element and a selection transistor. The MTJ element may include a fixed layer, a free layer, and a tunnel layer interposed therebetween. A magnetization direction of the fixed layer may be pinned, and a magnetization direction of the free layer may be the same as or reverse to that of the fixed layer, based on a condition.

Figure 11:
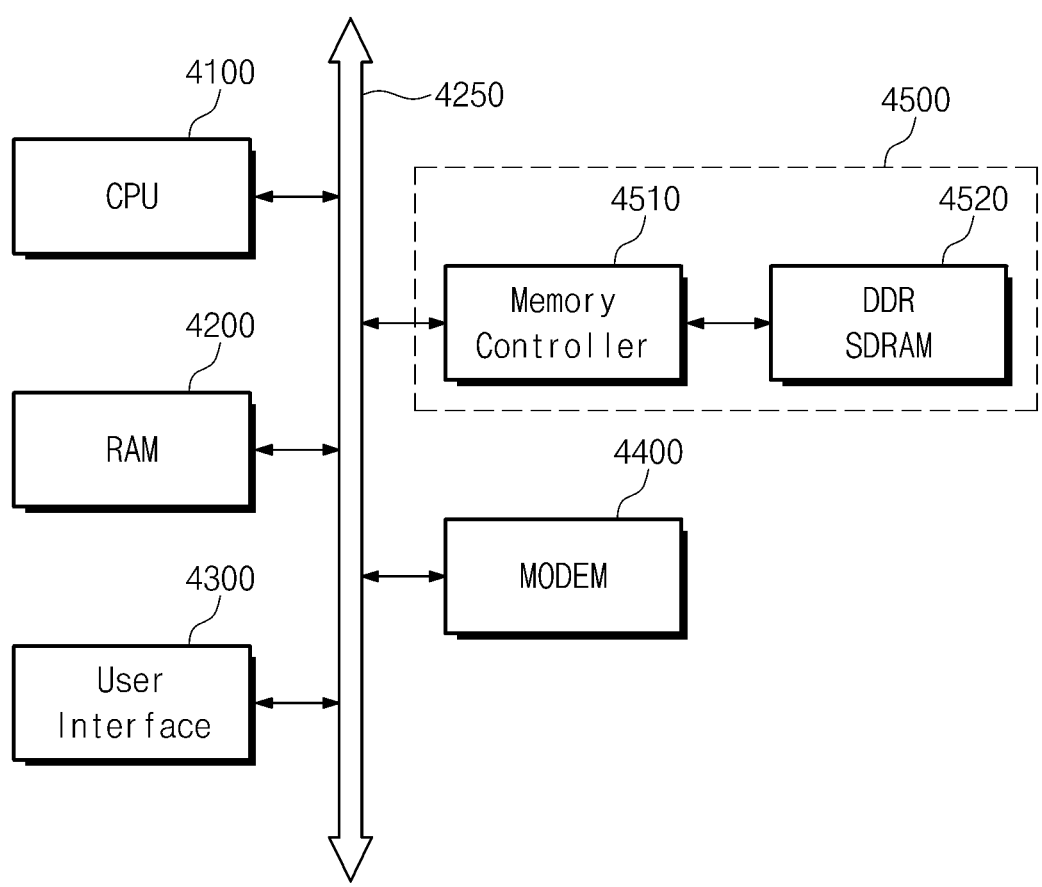
FIG. 11 is a block diagram schematically illustrating a computing device according to an example embodiment of the inventive concepts.

FIG. 11 is a block diagram schematically illustrating a computing device according to an example embodiment of the inventive concepts.

Referring to FIG. 11, a computing device may include a memory system 4500 which includes a DDR SDRAM 4520 and a memory controller 4510. The computing device may include an information processing device, a computer, or the like. For example, the computing device may include the following as well as the memory system 4500: a modem 4400, a central processing unit (CPU) 4100, a RAM 4200, and a user interface 4300 electrically connected to a system bus 4250. Data processed by the CPU 4100 or data received from an external device may be stored at the memory system 4500.

In the case where the DRAM 4520 is a DDR4 SDRAM, the DDR SDRAM 4520 may be composed of two or more dies in a mono-package. Furthermore, the DDR SDRAM 4520 may be implemented in the HBM structure according to an example embodiment of the inventive concepts. Therefore, soft data fail in a stacked chip structure may be easily analyzed and relieved.

The computing device may be applied to a solid state disk, a camera image sensor, and any other application chipset. For example, the memory system 4500 may be implemented with an SSD of a two-dimensional or three-dimensional structure. In this case, the computing device may stably and reliably store mass data at the memory system 4500.

The memory controller 4510 may provide the DDR SDRAM 4520 with a command, an address, data, or control signals.

The CPU 4100 may control the computing device overall and may function as a host.

A host interface between the CPU 4100 and the memory controller 4510 may include a variety of protocols for changing exchange between the memory controller 4510 and the host. The memory controller 4510 may be figured to communicate with the host or an external device by means of at least one of various protocols including the following: universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol.

According to an example embodiment of the inventive concepts, soft data fail occurring in a high bandwidth memory structure or a stacked chip structure may be easily analyzed and relieved.

While the inventive concepts has been described with reference to example embodiments, it will be apparent to those skilled in the art that various changes and modifications may be made without departing from the spirit and scope of the inventive concepts. Therefore, it should be understood that the above embodiments are not limiting, but illustrative.

For example, an embodiment of the inventive concepts is exemplified as soft data fail of a HBM or a stacked chip structure is relieved. However, the scope and spirit of the inventive concepts may not be limited thereto. For example, fail detection and correction methods or implementation thereof may be changed or modified by changing circuits and methodical configurations of drawings or by adding or eliminating circuits and methodical configurations without departing the spirit and scope of the inventive concepts.

What is claimed is:

1. A semiconductor memory device comprising:
a first die group comprising at least one buffer die; and
a second die group comprising a plurality of memory dies, the plurality of memory dies stacked on the first die group, each of the memory dies included in the plurality of memory dies being configured to convey transmission data through at least one of a plurality of through silicon via (TSV) lines,
wherein at least one of the plurality of memory dies includes a memory cell array including a data area and a parity area, and a first type error correction coding (ECC) circuit configured to correct a read error by performing error correction on read data from the memory cell array and generate corrected read data before the respective one of the at least one of the plurality of memory dies in which the first type ECC circuit is included conveys the corrected read data as the transmission data, and generate transmission parity bits based on the transmission data,
wherein the at least one buffer die includes a second type ECC circuit configured to
correct a transmission error to generate corrected transmission data using the transmission parity bits when the transmission error occurs in the transmission data received through the plurality of TSV lines if the transmission error is correctable, and
generate information indicating a data error if the transmission error is not correctable, and
wherein the at least one buffer die is configured to
transmit the corrected transmission data if the transmission error is correctable, and
transmit the information indicating a data error if the transmission error is not correctable.

2. The semiconductor memory device of claim 1, wherein the semiconductor memory device is a stacked memory device configured to convey the transmission data and control signals through the plurality of TSVs lines.

3. The semiconductor memory device of claim 1, wherein the transmission error occurring in the transmission data is a soft data fail which occurs due to noise of the plurality of TSV lines.

4. The semiconductor memory device of claim 1, wherein the semiconductor memory device is applied to a 3D chip structure or a 2.5D chip structure.

5. The semiconductor memory device of claim 1, wherein each of the plurality of memory dies comprises DRAM cells.

6. The semiconductor memory device of claim 1, wherein at least one of the plurality of memory dies comprises DRAM cells.

7. The semiconductor memory device of claim 1, wherein the semiconductor memory device is of a 3D chip structure to communicate with a host.

8. The semiconductor memory device of claim 7, wherein the host is connected with the buffer die through a data bus.

9. A semiconductor memory device comprising:
   a buffer die on a substrate; and
   a plurality of memory dies stacked on the buffer die and each of the plurality of memory dies being configured to transmit transmission data through at least one of a plurality of through silicon via (TSV) lines,
   wherein each of the plurality of memory dies includes a memory cell array including a data area and a parity area, and a first type error correction coding (ECC) circuit configured to correct a read error by performing error correction on read data from the memory cell array and generate the corrected read data before the respective one of the at least one of the plurality of memory dies in which the first type ECC circuit is included transmits the corrected read data as the transmission data, and generate transmission parity bits based on the transmission data,
   wherein the buffer die includes a second type ECC circuit configured to
   check whether a transmission error occurs in the transmission data received through the plurality of TSV lines
   correct the transmission error to generate corrected transmission data based on the transmission parity bits upon detecting the transmission error, if the transmission error is correctable, and
      generate information indicating a data error if the transmission error is not correctable, and
   wherein the buffer die is configured to
      transmit the corrected transmission data if the transmission error is correctable, and
      transmit the information indicating a data error if the transmission error is not correctable.

10. The semiconductor memory device of claim 9, wherein the semiconductor memory device is a stacked memory device in which the buffer die and the memory dies are stacked on the substrate and are connected through TSV lines.

11. The semiconductor memory device of claim 9, wherein the transmission error occurring in the transmission data comprises a soft data fail which occurs due to noise of the plurality of TSV lines.

12. The semiconductor memory device of claim 9, wherein the buffer die communicates with a host through a data bus in a 2.5D chip structure.

13. A semiconductor memory device comprising:
   a first die group comprising at least one buffer die; and
   a second die group comprising a plurality of memory dies stacked on the first die group and each of the memory dies included in the plurality of memory dies being configured to convey transmission data through a plurality of through silicon via (TSV) lines,
   wherein at least one of the plurality of memory dies comprises a memory cell array including a data area and a parity area, and a cell core error correction coding (ECC) circuit configured to correct a read error by performing error correction on read data from the memory cell array and generate corrected read data before the respective one of the at least one of the plurality of memory dies in which the cell core ECC circuit is included conveys the corrected read data as the transmission data, and generate transmission parity bits based on the transmission data, and
   wherein at least one of the at least one buffer die comprises a via ECC circuit which is configured to
      correct, when a transmission error occurs in the transmission data received through the plurality of TSV lines, the transmission error using the transmission parity bits if the transmission error is correctable,
      generate error-corrected transmission data if the transmission error is correctable,
      send the error-corrected transmission data to a host if the transmission error is correctable,
      generate information indicating a data error if the transmission error is not correctable, and
      transmit the information indicating a data error if the transmission error is not correctable.

14. The semiconductor memory device of claim 13, wherein the semiconductor memory device is a stacked memory device configured to conveys the transmission data and control signals through the plurality of TSV lines.

15. The semiconductor memory device of claim 13, wherein the transmission error occurring in the transmission data is a soft data fail which occurs due to noise of the plurality of TSV lines.

16. The semiconductor memory device of claim 13, wherein each of the plurality of memory dies comprises DRAM cells.

* * * * *